United States Patent
Sridhar et al.

(10) Patent No.: US 7,514,309 B2
(45) Date of Patent: Apr. 7, 2009

(54) METHODS TO SELECTIVELY PROTECT NMOS REGIONS, PMOS REGIONS, AND GATE LAYERS DURING EPI PROCESS

(75) Inventors: Seetharaman Sridhar, Richardson, TX (US); Craig Hall, Allen, TX (US); Che-Jen Hu, Plano, TX (US); Antonio Luis Pacheco Rotondaro, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/184,337

(22) Filed: Jul. 19, 2005

(65) Prior Publication Data

US 2007/0020839 A1 Jan. 25, 2007

(51) Int. Cl.
*H01L 21/8238* (2006.01)

(52) U.S. Cl. .................. 438/199; 438/229; 438/231; 257/E21.585

(58) Field of Classification Search .................. 438/199, 438/229, 230, 231, 232, 233
See application file for complete search history.

(56) References Cited

U.S. PATENT DOCUMENTS

| | | | |
|---|---|---|---|
| 4,963,502 A * | 10/1990 | Teng et al. .................. 438/225 |
| 6,544,874 B2 * | 4/2003 | Mandelman et al. ......... 438/589 |
| 6,621,131 B2 | 9/2003 | Murthy et al. |
| 6,642,125 B2 | 11/2003 | Oh et al. |
| 6,900,502 B2 | 5/2005 | Ge et al. |
| 2004/0262694 A1 * | 12/2004 | Chidambaram .............. 257/369 |
| 2005/0035409 A1 * | 2/2005 | Ko et al. ...................... 257/350 |
| 2005/0139872 A1 * | 6/2005 | Chidambaram et al. ..... 257/288 |

* cited by examiner

*Primary Examiner*—Michael Trinh
(74) *Attorney, Agent, or Firm*—Wade J. Brady, III; Frederick J. Telecky, Jr.

(57) ABSTRACT

A semiconductor device is fabricated with a protective liner and/or layer. Well regions and isolation regions are formed within a semiconductor body. A gate dielectric layer is formed over the semiconductor body. A gate electrode layer, such as polysilicon, is formed on the gate dielectric layer. A protective gate liner is formed on the gate electrode layer. A resist mask is formed that defines gate structures. The gate electrode layer is patterned to form the gate structures. Offset spacers are formed on lateral edges of the gate structures and extension regions are then formed in the well regions. Sidewall spacers are then formed on the lateral edges of the gate structures. An NMOS protective region layer is formed that covers the NMOS region of the device. A recess etch is performed within the PMOS region followed by formation of strain inducing recess structures.

9 Claims, 8 Drawing Sheets

METHODS TO SELECTIVELY PROTECT NMOS REGIONS, PMOS REGIONS, AND GATE LAYERS DURING EPI PROCESS

FIELD OF INVENTION

The present invention relates generally to semiconductor devices and more particularly to transistor devices and associated methods of manufacture that employ epitaxial growth layers to improve channel mobility.

BACKGROUND OF THE INVENTION

A conventional MOS transistor generally includes a semiconductor substrate, such as silicon, having a source, a drain, and a channel positioned between the source and drain. A gate stack composed of a conductive material (a gate conductor), an oxide layer (a gate oxide), and sidewall spacers, is typically located above the channel. The gate oxide is typically located directly above the channel, while the gate conductor, generally comprised of polycrystalline silicon (polysilicon) material, is located above the gate oxide. The sidewall spacers protect the sidewalls of the gate conductor.

Generally, for a given electric field across the channel of a MOS transistor, the amount of current that flows through the channel is directly proportional to the mobility of carriers in the channel. Thus the higher the mobility of the carriers in the channel, the more rapidly the carriers will pass through the channel and the faster a circuit can perform when using high mobility MOS transistors. Additionally, improving the mobility of the carriers in the channel can allow device operation at lower voltages.

A number of techniques can be employed to improve mobility of the carriers in the channel. One technique is to reduce the channel length and/or the thickness of the gate oxide thereby shortening the distances carriers must travel and increasing current drive and switching performance. However, reducing the thickness of the gate oxide results in an increase in gate tunneling current, which in turn degrades the performance of the device by increasing off state leakage. Furthermore, decreasing the thickness of the gate oxide and/or the channel length requires more advanced and expensive lithography technology.

Another technique to increase the mobility of the carriers in the channel of an MOS transistor is to produce a mechanical stress or strain in the channel. A compressive strained channel typically provides hole mobility enhancement, which is particularly beneficial for PMOS devices, whereas a tensile strained channel typically provides electron mobility enhancement, which is particularly beneficial for NMOS devices. Generally, a layer is formed that has a lattice mismatch between the formed layer and underlying substrate and channel. The lattice mismatch then induces strain across a channel region.

One drawback to improving channel mobility via strain is that compressive strain, which generally improves hole mobility for silicon substrate devices, can degrade electron mobility and that tensile strain, which improves electron mobility for silicon substrate based devices, can also degrade hole mobility. As a result, introducing tensile strain can improve performance of NMOS devices but degrade performance of PMOS devices. Similarly, introducing compressive strain can improve performance of PMOS devices but degrade performance of NMOS devices.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates semiconductor device fabrication by forming and employing protective liners and/or layers during strain inducing epitaxial layer formation. Uniformity of electrode gate layers, such as polysilicon, is enhanced by employing a protective liner that mitigates damage, such as thinning, during epitaxial layer formation. Additionally, NMOS or PMOS regions are protected by another protective layer during epitaxial growth formation. As a result, channel mobility and device performance can be improved without substantial degradation to the polysilicon gate layers and/or CMOS regions.

In accordance with an aspect of the present invention, a method for fabricating a semiconductor device with a protective liner and/or layer is provided. Well regions and isolation regions are formed within a semiconductor body. A gate dielectric layer is formed over the semiconductor body. A gate electrode layer, such as polysilicon, is formed on the gate dielectric layer. A protective gate liner is formed on the gate electrode layer. A resist mask is formed that defines gate structures. The gate electrode layer is patterned to form the gate structures. Offset spacers are formed on lateral edges of the gate structures and extension regions are then formed in the well regions. Sidewall spacers are then formed on the lateral edges of the gate structures. An NMOS protective region layer is formed that covers the NMOS region of the device. A recess etch is performed within the PMOS region followed by formation of strain inducing recess structures. Other methods are disclosed.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
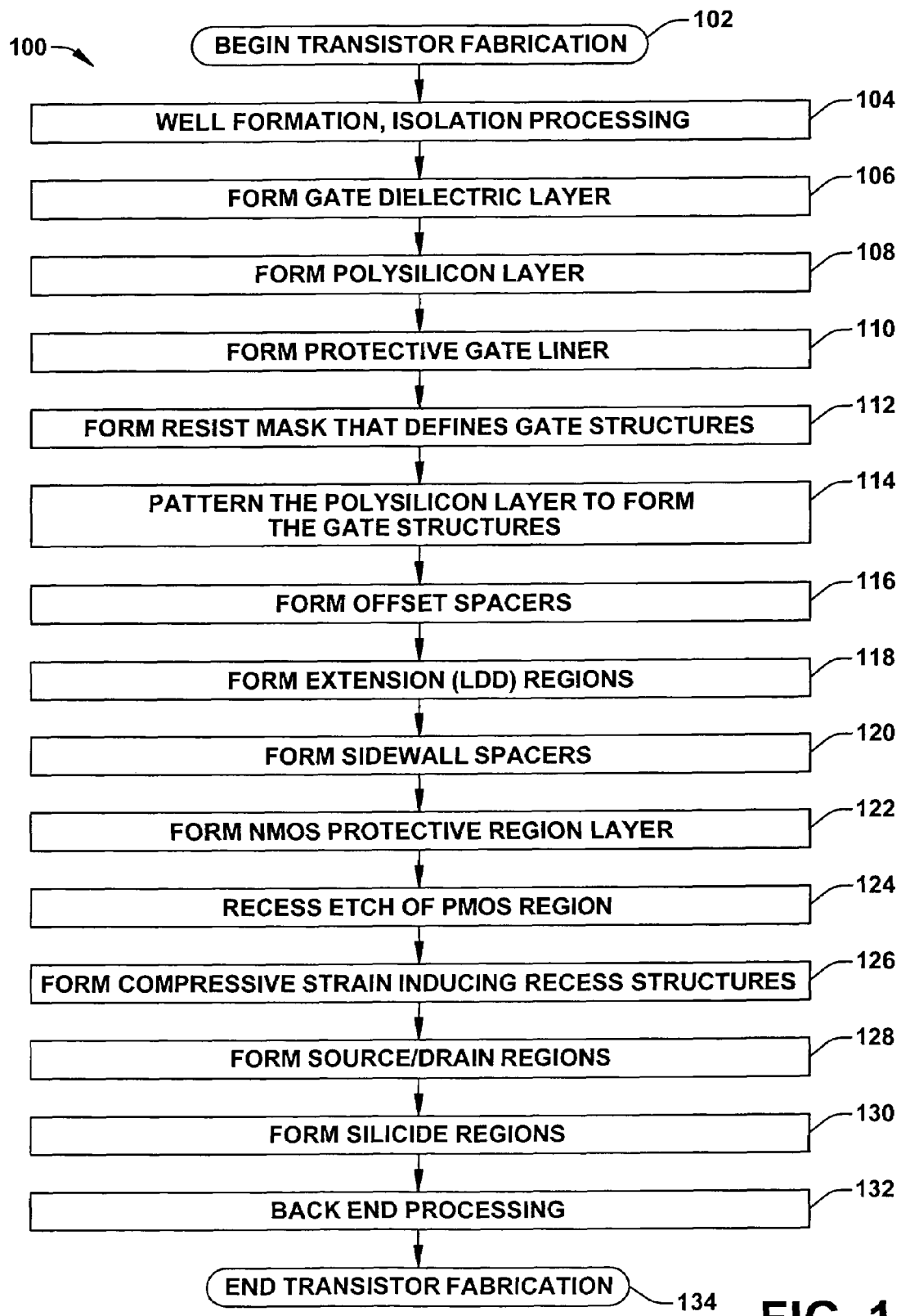
FIG. 1 is a flow diagram illustrating a method of fabricating a semiconductor device wherein tailored channel strain profiles are applied to NMOS and PMOS regions in accordance with an aspect of the present invention.

One or more implementations of the present invention will now be described with reference to the attached drawings, wherein like reference numerals are used to refer to like elements throughout, and wherein the illustrated structures are not necessarily drawn to scale. The invention provides transistor structures and methods in which transistor mobility is improved.

One mechanism employed to induce strain into channel regions and, thereby, improve channel mobility is to form epitaxial layers or recess structures that induce appropriate strain. Generally, after gate formation, recessed regions are formed by etching a semiconductor body to a particular depth. Subsequently, the recessed regions are filled with an epitaxial fill material or other strain inducing material to form recess structures. However, the formation of the recess structures can have negative consequences as well.

The formation of the recessed regions and recess structures is performed after gate structure formation. As a result, portions of gate electrode layers, such as polysilicon layers, are undesirably etched and thinned in some locations. For example, the gate electrode layers may be thinner in one region (e.g., a PMOS or NMOS region) due to the recess etch than another. Thus, undesirable differentials in gate electrode layers can be obtained for different regions of devices. Additionally, the epitaxial fill or growth processes typically employed can form undesired materials onto the gate electrode layers, non-fill regions (e.g., a PMOS or NMOS) and elsewhere in the device that degrade performance and operation.

The present invention facilitates semiconductor device fabrication by employing protective liners and layers that mitigate the above negative consequences and allow employing recess structures that improve channel mobility by inducing strain. The protective liners and layers protect underlying layers during both recess etching and recess filling processes.

FIG. 1 is a flow diagram illustrating a method 100 of fabricating a semiconductor device wherein tailored channel strain profiles are applied to NMOS and PMOS regions in accordance with an aspect of the present invention. While the exemplary method 100 is illustrated and described below as a series of acts or events, it is appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement the method 100 in accordance with the present invention. Furthermore, the method 100 according to the present invention may be implemented in association with the fabrication of ICs and composite transistors illustrated and described herein, as well as in association with other transistors and structures not illustrated, including but not limited to NMOS and/or PMOS composite transistors.

The method 100 begins at block 102, wherein transistor fabrication is initiated, and transistor well formation and isolation processing are performed at block 104, thereby defining NMOS and PMOS regions. The NMOS region comprises a P-well regions (having p-type conductivity) in which n-type source/drain regions are later formed. The PMOS region comprises N-well regions (having n-type conductivity) in which p-type source/drain regions are later formed. The p-well regions are formed by selectively implanting p-type dopant(s) into a semiconductor body within the NMOS region and the n-well regions are formed by selectively implanting n-type dopant(s) into the semiconductor body within the PMOS region. In addition, isolation regions may comprise shallow trench isolation (STI) or field oxide regions (LOCOS) that are formed in/on the semiconductor body and serve to define various active areas and electrically isolate various active areas laterally from one another.

The method 100 continues at block 106, wherein a gate dielectric layer is formed in active areas defined by the various formed isolation regions. In one example, the gate dielectric comprises a thin, thermally grown silicon dioxide layer, however, other type gate dielectrics (such as high-k dielectrics) may be formed and are contemplated by the present invention. A polysilicon layer is then deposited, such as by a chemical vapor deposition (CVD) process, over the gate dielectric at block 108. The polysilicon layer is conductive and subsequently serves as gate electrodes for transistor devices within the NMOS and PMOS regions. It is noted that other conductive layers can also be employed in place of the polysilicon layer and still be in accordance with the present invention.

A protective gate liner is then formed on the polysilicon layer at block 110. The protective gate liner generally comprises silicon dioxide, silicon nitride, and/or a combination thereof. In one example, the protective gate liner is formed by depositing a silicon rich silicon nitride layer with a thickness of about 490 Angstroms and then forming a silicon oxynitride layer on the silicon rich silicon nitride layer, wherein the silicon oxynitride layer has a thickness of about 200 Angstroms.

A resist mask is formed over the protective gate liner and the polysilicon layer at block 112. The resist mask exposes active regions of the device, but covers target gate structures and underlying portions of the polysilicon layer and the protective gate liner. Subsequently, the polysilicon layer and the gate dielectric layer are patterned at block 114 via the resist mask to form gate structures within the NMOS and PMOS regions. The protective gate liner remains on the polysilicon layer due to the presence of the resist mask. For the exemplary protective gate liner describe above, a portion of the silicon oxynitride layer is typically removed, but the full amount of the silicon nitride layer remains.

Subsequently, offset spacers are formed on lateral edges of the gate structures at block 116. For example, a thin offset layer (e.g., an oxide or nitride layer) is formed generally conformally over the patterned gate and then etched using a generally anisotropic dry etch to remove offset layer material on top of the gate and in the active regions, leaving a thin offset spacer material on lateral edges of the gate.

An extension region implant or lightly doped drain (LDD) implant is then performed at block 118 to form extension regions, wherein dopants are introduced into active regions of the device. The active regions are located within the semiconductor substrate and outside of the gate structures. In an exemplary extension region formation process, lightly doped, medium doped or heavily doped extension region implants are performed in the NMOS and PMOS regions, wherein the gate structure serves to self-align the extension regions. A thermal process such as a rapid thermal anneal can then be employed to activate the extension region dopants, which causes the extension regions to diffuse laterally slightly underneath the offset spacer toward the channels.

Still referring to FIG. 1, sidewall spacers are then formed on the gate structures at block 120. The sidewall spacers comprise an insulating material such as oxide, nitride or a combination of such layers. The spacers are formed by depositing a layer of such spacer material(s) over the device in a generally conformal manner, followed by an anisotropic etch thereof, thereby removing such spacer material from the top of the gate structure and from the moat or active area and leaving a region on the lateral edges of the gate structure, overlying the offset spacers. The sidewall spacers are substantially thicker than the offset spacers, thereby resulting in the subsequently formed source/drain regions to be offset from lateral edges of the gate.

An NMOS protective region layer is formed over the NMOS region of the device at block 122. The protective region, similar to the gate protective liner, protects the NMOS region and prevents undesired epitaxial layer formation within the NMOS region during related recess and fill processes performed below. The protective region layer is typically comprised of silicon dioxide, silicon nitride, silicon oxynitride, and combinations thereof. It is noted that in some aspects, the protective region layer is comprised of a different material than that employed for the gate protective liner in order to facilitate etching of one without removing the other. For example, if the gate protective liner is comprised of silicon nitride, the protective region layer is typically comprised of oxide.

A PMOS recess etch is performed at block 124 that removes a surface portion of semiconductor material from the n-well regions within the semiconductor body and forms recessed regions having a selected thickness and/or depth. A mask can be employed to cover the NMOS region and expose the PMOS region or an etch process can be employed that is selective to the material comprising the protective region layer and the protective gate liner. In one example, the recessed regions are formed using a dry etching process such as the chemistry employed to etch STI trenches in the semiconductor body when forming isolation regions, as stated above. Some exemplary depths for the recessed region include about 20 nm to about 120 nm, however other suitable depths can be employed.

The method 100 then continues at block 126, wherein recess structures comprised of a compressive strain producing material, such as silicon-germanium, are formed in the PMOS recessed regions. Some examples of suitable recess structure formation processes include chemical vapor deposition (CVD), molecular beam epitaxy (MBE), and the like. Sources for silicon and germanium (either gas or solid, technique dependent) are employed to control the composition of the filled recess structures. The flow of the source gases can be controlled to alter the composition of the strain producing material. Additionally, the formed structures are typically thicker than the recessed regions in order to mitigate damage from later removal. Subsequently, the protective region layer and the protective gate liner are removed.

The gate structures and the NMOS region are protected during formation of the recess structures due to the protective gate liner and protective region layer, respectively. The protective gate liner prevents or mitigates formation of the recess structures or other materials during the formation process. As a result, the polysilicon layer remains substantially uniform. The protective region layer prevents or mitigates formation of the recess structures and/or other related materials within the NMOS region during the formation process. Therefore, the NMOS region remains substantially undamaged from the recess structure formation processes. It is noted that a photoresist mask cannot be employed in place of the protective region layer due to the processes and/or temperatures employed in forming the recess structures.

Source/drain regions are then formed in the PMOS and NMOS regions at block 128. The source/drain regions are formed in the NMOS region by implanting n-type dopants (e.g., arsenic and/or phosphorous). The source/drain dopant is introduced into the exposed areas (top of gate structures and active areas not covered by the sidewall spacers). The source/drain regions are formed within the PMOS region by implanting p-type dopants (e.g., boron) at block 126. The source/drain dopant is introduced into the exposed areas (top of gate electrode and active areas not covered by the sidewall spacers). Alternately, source/drain dopants can be implanted during the formation of the filled recess structures for the PMOS region. Subsequently, the mask can be removed and a thermal process can then be performed to activate dopants within the source/drain regions of both the NMOS and PMOS regions.

Subsequently, silicide processing is performed at block 130, wherein a refractory metal material is formed over the device, followed by a thermal process, wherein the metal and silicon interfaces react to form a silicide (on top of the gate and in the source/drain regions). Unreacted metal is then stripped away, and back end processing such as interlayer dielectric and metallization layers are formed at block 132 to conclude the device formation at block 134.

It is noted that the variations of the method 100 in accordance with the present invention contemplate forming recessed regions and recess structures within the NMOS region in addition to or in place of forming these structures within the PMOS region. If these structures are formed in both regions, a second protective region layer is employed.

Figure 2A:
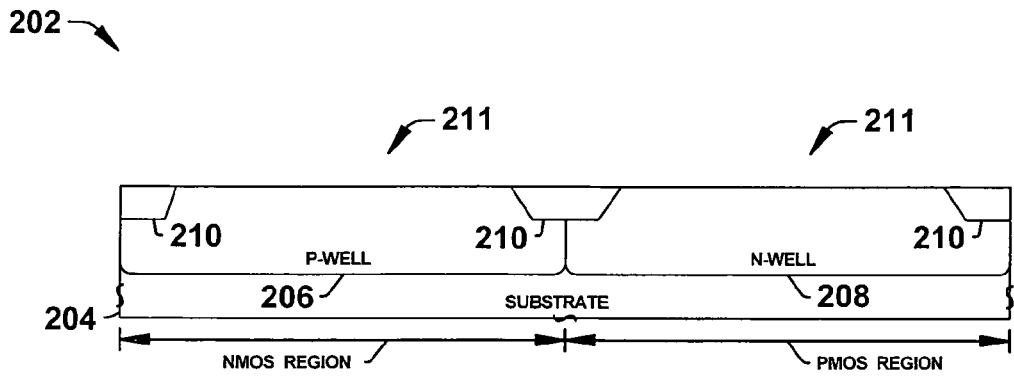
FIGS. 2A to 2P are a plurality of fragmentary cross section views illustrating a transistor device being formed in accordance with an aspect of the present invention by the method of FIG. 1.
Figure 2B:
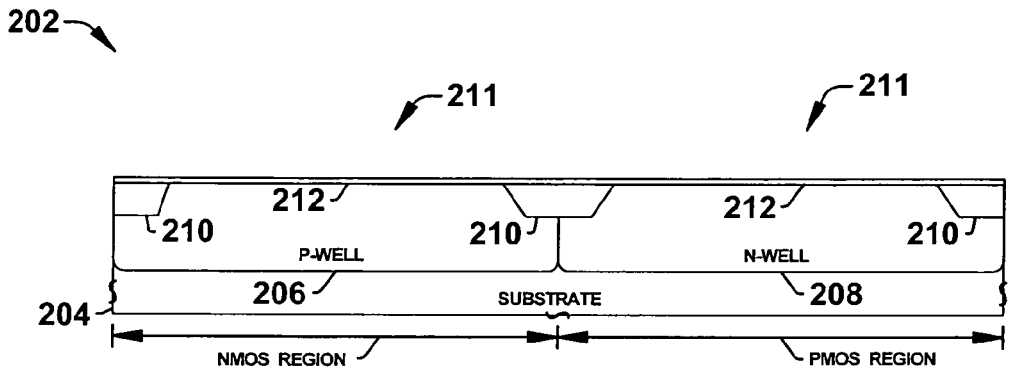
Figure 2C:
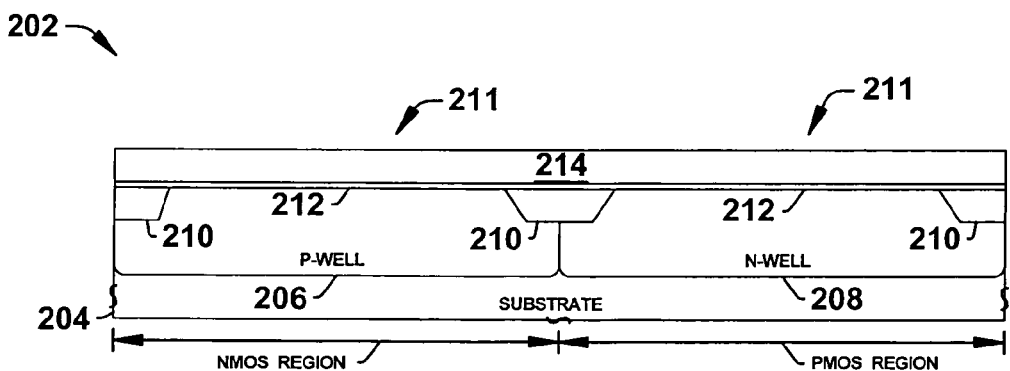
Figure 2D:
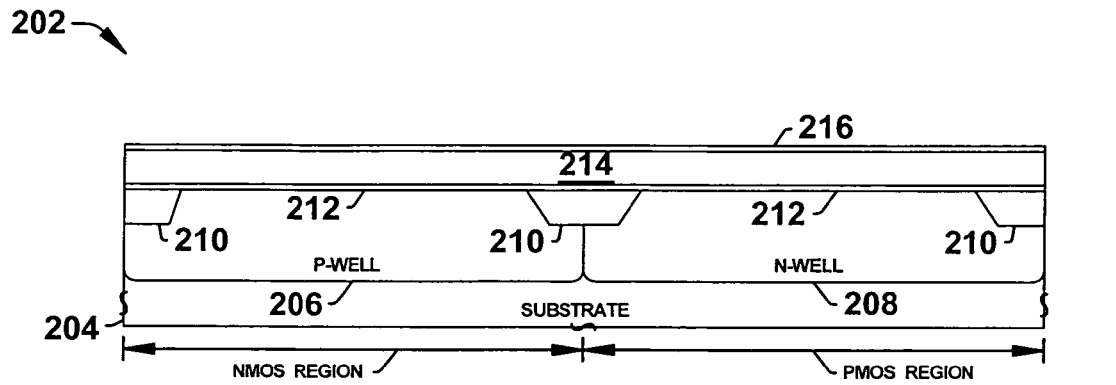
Figure 2E:
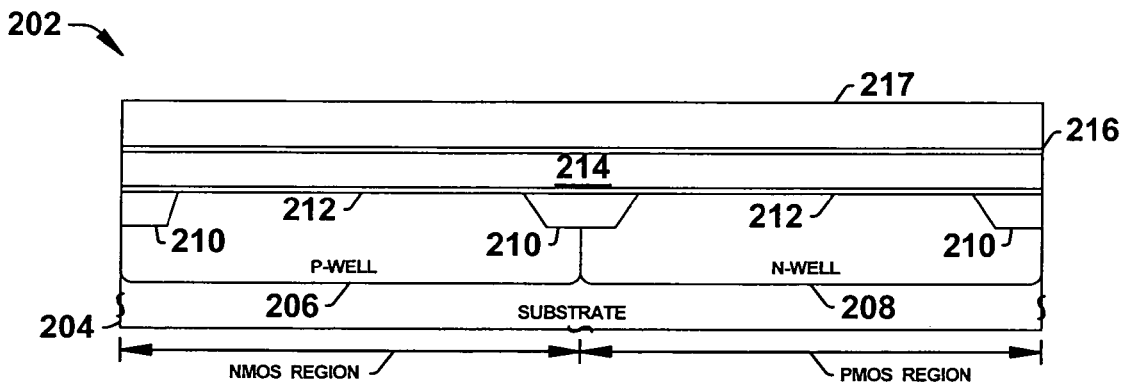
Figure 2F:
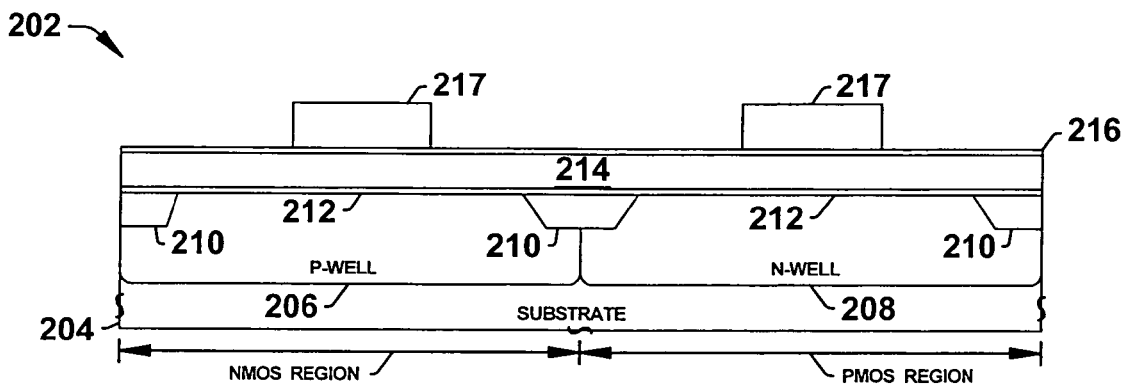
Figure 2G:
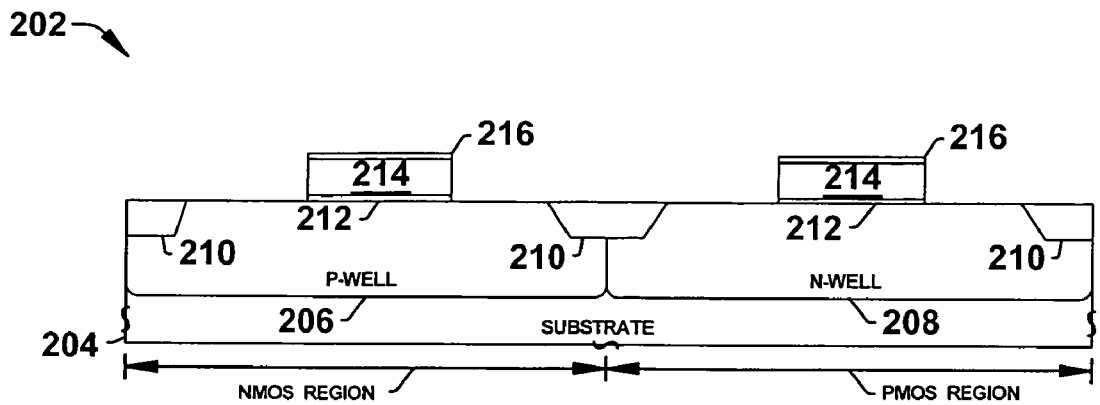
Figure 2H:
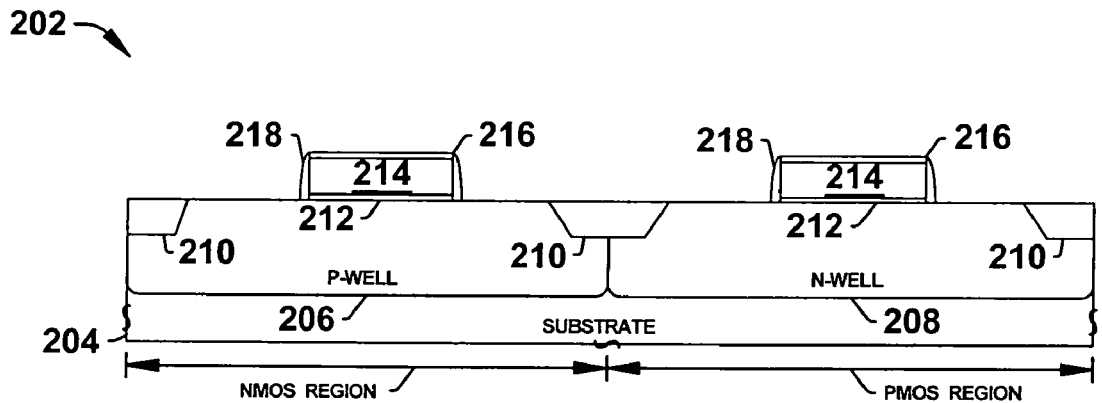
Figure 2I:
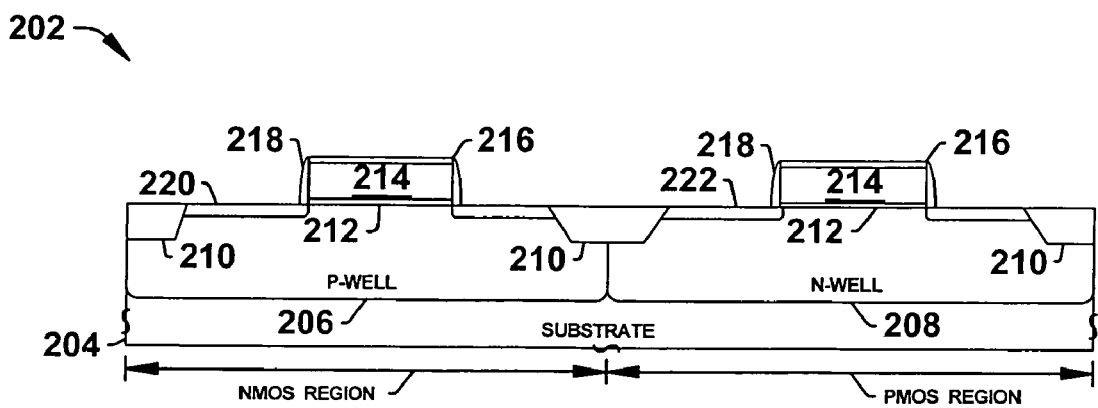
Figure 2J:
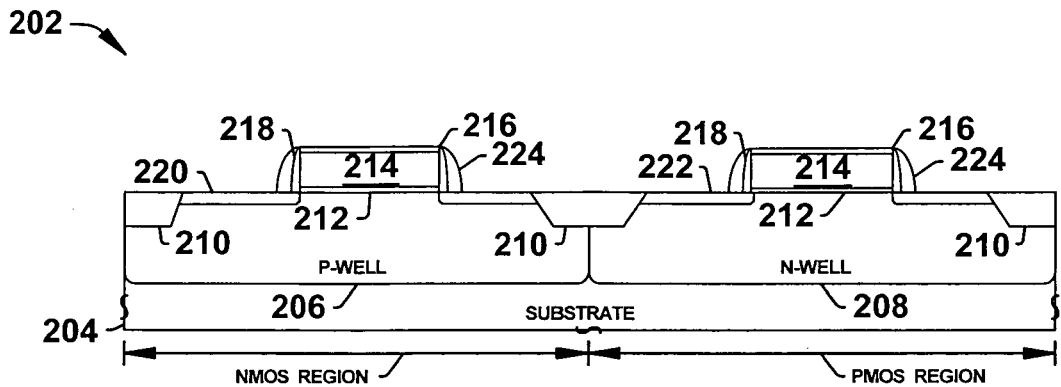
Figure 2K:
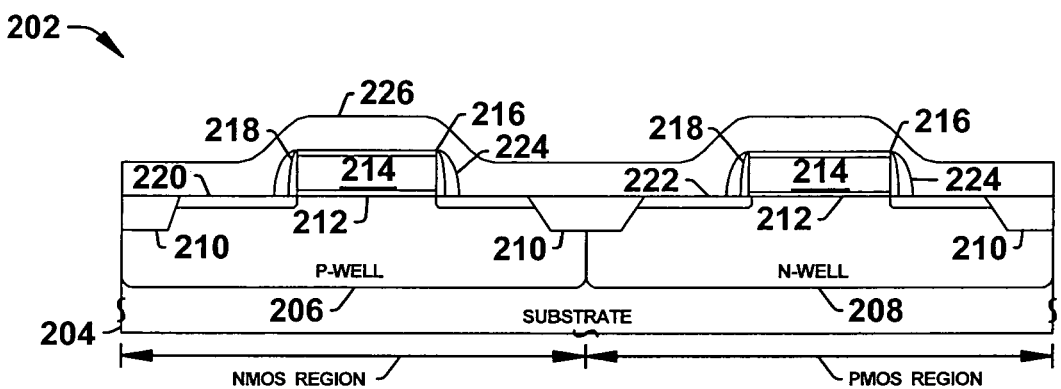
Figure 2L:
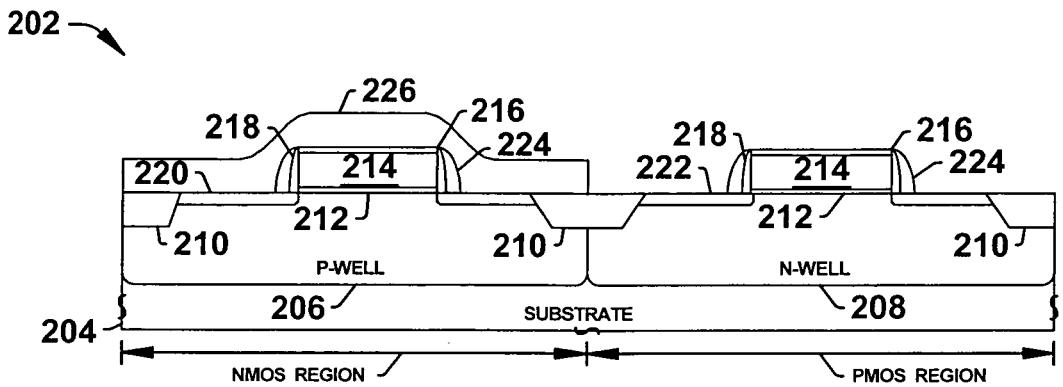
Figure 2M:
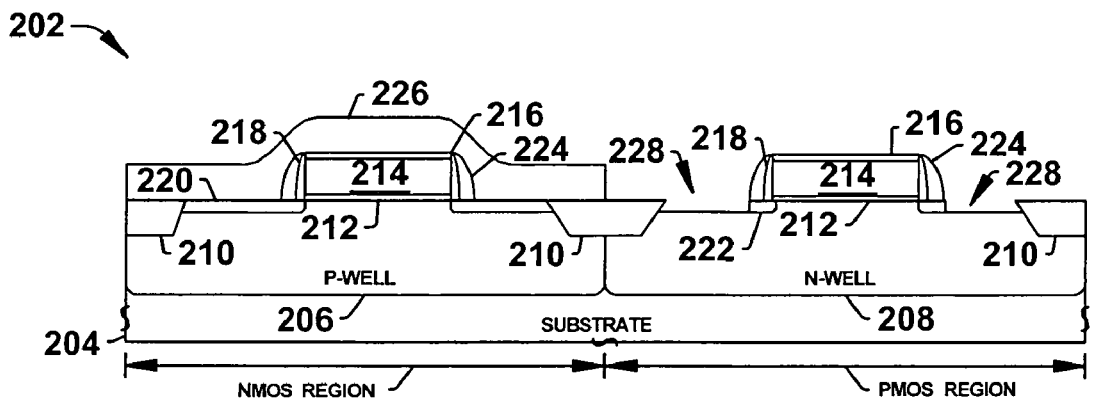
Figure 2N:
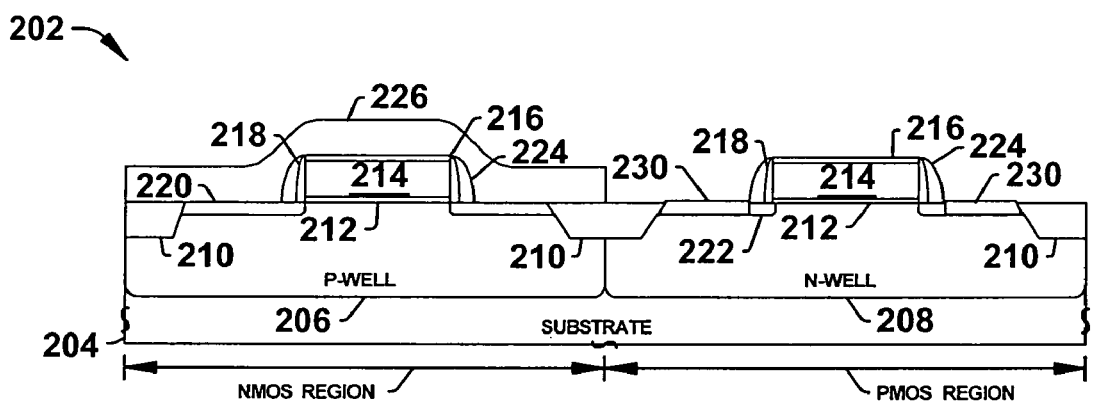
Figure 2O:
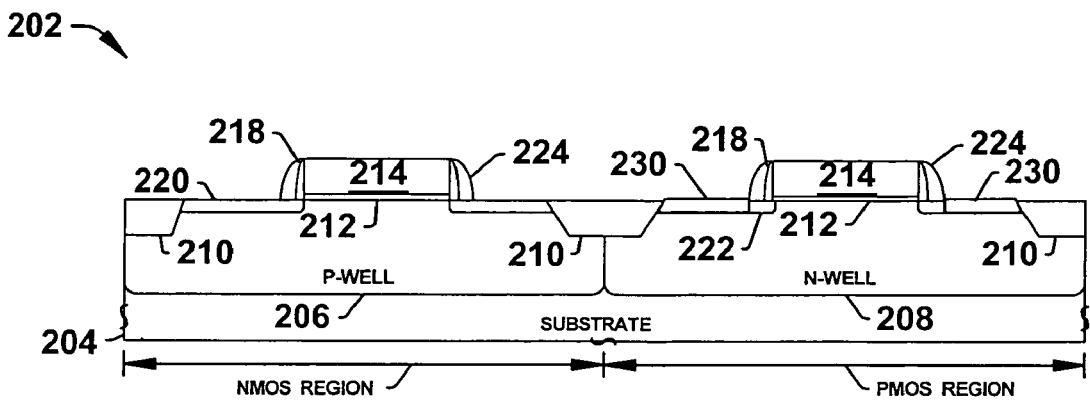
Figure 2P:
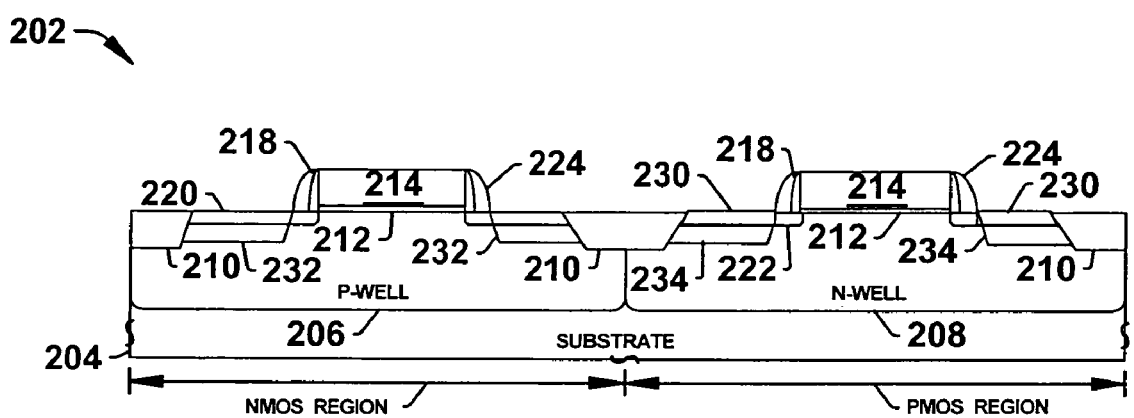

Turning now to FIGS. 2A to 2P, a plurality of fragmentary cross section views illustrating a transistor device 202 being formed in accordance with an aspect of the present invention by the method 100 of FIG. 1 are provided. The transistor device 202 is a CMOS device that includes NMOS and PMOS regions and employs protective liners and layers during formation to mitigate damage and/or unwanted formation during formation of strain inducing recess structures. The device 202 is exemplary in nature and is provided merely to facilitate understanding of the present invention. Additionally, it is appreciated that other transistor devices employing one or more protective layers, but vary in some manner from the device 202, are contemplated and in accordance with the present invention.

In FIG. 2A, a transistor device 202 is provided, wherein a semiconductor body 204, such as a semiconductor substrate, has a number of wells formed therein, such as p-well regions 206 to define an NMOS transistor device region and p-well regions 208 to define a PMOS transistor device region, respectively. Further, isolation regions 210 such as STI regions are formed in the semiconductor body to define active area regions 211, as may be appreciated. In FIG. 2B, the transistor device 202 is illustrated, wherein a gate dielectric layer 212 has been formed, for example, by thermally grown $SiO_2$, over the active regions 211.

A polysilicon layer 214 is formed over the device 202 and forms on the gate dielectric layer 212, as shown in FIG. 2C. The polysilicon layer 214 can be formed by a suitable deposition process, such as a polysilicon CVD process. Thereafter, a protective gate liner 216 is formed on the polysilicon layer. The protective gate liner 216 is comprised of one or more insulative layers comprised of silicon dioxide, silicon nitride, and combinations thereof. FIG. 2D depicts the transistor device 202 after formation of the protective gate liner 216 on the polysilicon layer 214.

A layer of photo resist 217 is formed on the protective gate liner 216 and over the polysilicon layer 214 as shown in FIG. 2E. The layer 218 is then exposed and selected portions of the resist layer 217 are removed forming the mask 217 as shown in FIG. 2F. The mask 217 covers targeted gate structure regions and exposes areas elsewhere on the device 202.

FIG. 2G depicts the device 202 after patterning of the polysilicon layer 214 to form gate structures and removal of the resist mask 217. The polysilicon layer 214, along with the gate dielectric layer 212 and the protective gate liner 216, are patterned with the resist mask 218 to form the gate structures.

The patterning process removes exposed portions of the protective gate liner 216, the polysilicon layer 214, and the gate dielectric layer 212. The patterning process may, but not necessarily, remove a portion of the protective gate liner. However, the protective gate liner substantially remains on the polysilicon layer 214 due to the presence of the resist mask 217.

Offset spacers 218 are formed on lateral edges of the gate structure, as shown in FIG. 2H. For example, a thin offset layer (e.g., an oxide or nitride layer) is formed generally conformally over the patterned gate and then etched using a generally anisotropic dry etch to remove offset layer material on top of the gate and in the active regions 211, leaving a thin offset spacer material on lateral edges of the gate as the offset spacers 218.

FIG. 2I illustrates the semiconductor device 202 after formation of extension regions. N-type extension regions 220 are formed within the NMOS region and p-type extension regions 222 are formed within the PMOS region. An extension region implant or lightly doped drain (LDD) implant is employed to form the extension regions, wherein dopants are introduced into active regions 211 of the device. In an exemplary extension region formation process, lightly doped, medium doped or heavily doped extension region implants are performed in the NMOS and PMOS regions, wherein the gate structure serves to self-align the extension regions. A thermal process such as a rapid thermal anneal can then be employed to activate the extension region dopants, which causes the extension regions to diffuse laterally slightly underneath the offset spacer toward the channels. Typically, the n-type extension regions 220 and the p-type extension regions 222 are formed via separate implant processes and employ separate masks (not shown).

Sidewall spacers 224 are then formed on lateral edges of the gate structures as shown in FIG. 2J. The sidewall spacers 224 comprise an insulating material such as oxide, nitride or a combination of such layers. The spacers 224 are formed by depositing a layer of such spacer material(s) over the device in a generally conformal manner, followed by an anisotropic etch thereof, thereby removing such spacer material from the top of the gate structure and from the moat or active area 211 and leaving a region on the lateral edges of the gate structure, overlying the offset spacers 218. The sidewall spacers 224 are substantially thicker than the offset spacers 218, thereby resulting in the subsequently formed source/drain regions to be offset from lateral edges of the gate.

A protective region layer 226 is formed over the device in both the NMOS and PMOS regions as shown in FIG. 2K. The protective region layer 226 is comprised of an insulative material, such as silicon dioxide, silicon nitride, and/or combinations thereof. The protective region layer 226 is then removed from the PMOS region as shown in FIG. 2L.

FIG. 2M depicts the semiconductor device 202 after formation of recess regions 228. A PMOS recess etch is performed that removes a surface portion of semiconductor material from the n-well regions 208 within the semiconductor body 204 and forms the recessed regions 228 having a selected thickness and/or depth. A mask (not shown) can be employed to cover the NMOS region and expose the PMOS region or an etch process can be employed that is selective to the material comprising the protective region layer and the protective gate liner.

FIG. 2N illustrates the semiconductor device 202 after formation of strain inducing recess structures 230. The recess structures 230 are comprised of a compressive strain producing material, such as silicon-germanium, and are formed only within the PMOS recessed regions 228. Some examples of suitable recess structure formation processes include chemical vapor deposition (CVD), molecular beam epitaxy (MBE), and the like.

The recess structures 230 induce compressive type strain into channel regions underlying the gate structures within the PMOS region. The strain improves hole mobility, which in turn improves drive current for transistor devices within the PMOS region. This drive current is obtained without degrading performance for NMSO transistor devices. Furthermore, uniformity of the polysilicon layer 214 is maintained due to the protective gate liner 216 and integrity of the NMOS region is maintained due to the protective region layer 226.

Subsequently, the protective region layer 226 is removed by a suitable etch process, which is typically selective to the formed recess structures and the protective gate liner 216. Thereafter, another etch process is employed that removes the protective gate liner 216 from the NMOS and PMOS regions of the device 202. FIG. 2O depicts the semiconductor device 202 after removal of the protective gate liner 216 and the protective region layer 226.

Source/drain regions are then formed in the well regions as shown in FIG. 2P. N-type source/drain regions 232 are selectively formed in the NMOS region by implanting n-type dopant(s). Similarly, p-type source/drain regions 234 are selectively formed in the PMOS region by implanting p-type dopant(s).

Subsequently, silicide processing is performed to form silicide regions and metallization layers are formed to conclude the device formation.

It is noted that the variations of the device 202 in accordance with the present invention are contemplated. For example, formation of recessed regions and recess structures within the NMOS region can be performed in addition to or in place of forming these structures within the PMOS region. If these structures are formed in both regions, a second protective region layer is employed.

Figure 3:
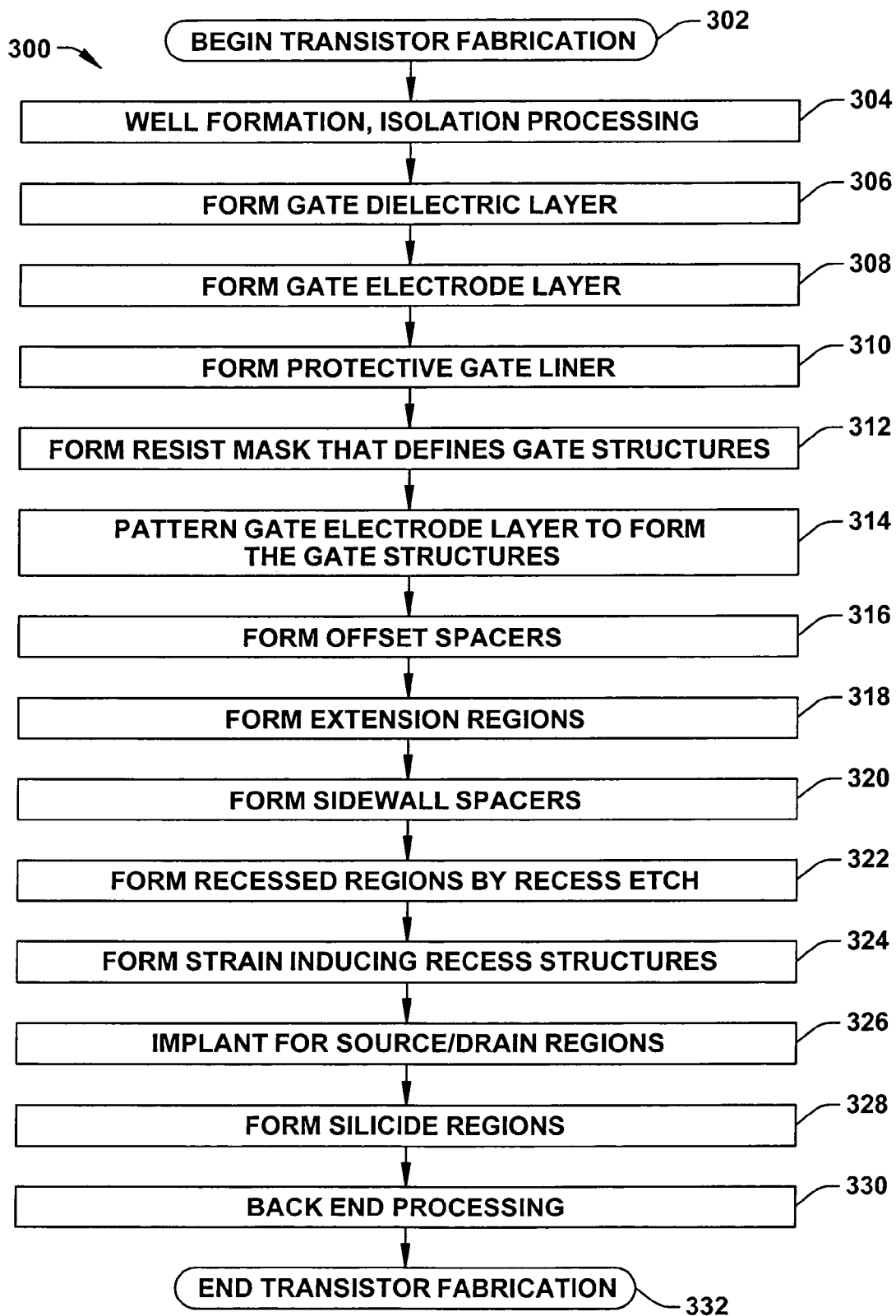
FIG. 3 is a flow diagram illustrating a method of fabricating a semiconductor device having a protective gate liner to mitigate degradation form formation of strain inducing recess structures.

FIG. 3 is a flow diagram illustrating a method 300 of fabricating a semiconductor device having a protective gate liner to mitigate degradation form formation of strain inducing recess structures. While the exemplary method 300 is illustrated and described below as a series of acts or events, it is appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement the method 300 in accordance with the present invention. Furthermore, the method 300 according to the present invention may be implemented in association with the fabrication of ICs and composite transistors illustrated and described herein, as well as in association with other transistors and structures not illustrated, including but not limited to NMOS and/or PMOS composite transistors.

The method 300 begins at block 302, wherein transistor fabrication is initiated, and transistor well formation and isolation processing are performed at block 304. Well regions, having n-type or p-type conductivity, are formed within a semiconductor body. Isolation regions are formed that define various active areas and electrically isolate various active areas from one another. Some examples of suitable isolation regions that can be formed include shallow trench isolation (STI) regions, field oxide regions (LOCOS) regions, and the like.

The method 300 continues at block 306, wherein a gate dielectric layer is formed in active areas defined by the various formed isolation regions. In one example, the gate dielectric comprises a thin, thermally grown silicon dioxide layer, however, other type gate dielectrics (such as high-k dielectrics) may be formed and are contemplated by the present invention. A gate electrode layer is then deposited over the gate dielectric at block 308. The gate electrode layer is comprised of a conductive material, such as polysilicon or metal, and subsequently serves as gate electrodes for transistor devices.

A protective gate liner is then formed on the polysilicon layer at block 310. The protective gate liner generally comprises silicon dioxide, silicon nitride, and/or a combination thereof. In one example, the protective gate liner is formed by depositing a silicon rich silicon nitride layer with a thickness of about 490 Angstroms and then forming a silicon oxynitride layer on the silicon rich silicon nitride layer, wherein the silicon oxynitride layer has a thickness of about 200 Angstroms.

A resist mask is formed over the protective gate liner and the polysilicon layer at block 312. The resist mask exposes active regions of the device, but covers target gate structures and underlying portions of the gate electrode layer and the protective gate liner. Subsequently, the gate electrode layer and the gate dielectric layer are patterned at block 314 via the resist mask to form gate structures within the device. The protective gate liner remains on the gate electrode layer due to the presence of the resist mask. For the exemplary protective gate liner describe above, a portion of the silicon oxynitride layer is typically removed, but the full amount of the silicon nitride layer remains.

Subsequently, offset spacers are formed on lateral edges of the gate structures at block 316. For example, a thin offset layer (e.g., an oxide or nitride layer) is formed generally conformally over the patterned gate and then etched using a generally anisotropic dry etch to remove offset layer material on top of the gate and in the active regions, leaving a thin offset spacer material on lateral edges of the gate.

An extension region implant or lightly doped drain (LDD) implant is then performed at block 318 to form extension regions, wherein dopants are introduced into active regions of the device. The active regions are located within the semiconductor substrate and outside of the gate structures. Still referring to FIG. 3, sidewall spacers are then formed on the gate structures at block 320. The sidewall spacers comprise an insulating material such as oxide, nitride or a combination of such layers. The spacers are formed by depositing a layer of such spacer material(s) over the device in a generally conformal manner, followed by an anisotropic etch thereof, thereby removing such spacer material from the top of the gate structure and from the moat or active area and leaving a region on the lateral edges of the gate structure, overlying the offset spacers. The sidewall spacers are substantially thicker than the offset spacers, thereby resulting in the subsequently formed source/drain regions to be offset from lateral edges of the gate.

A recess etch is performed at block 322 that removes a surface portion of semiconductor material from the well regions within the semiconductor body and forms recessed regions having a selected thickness and/or depth. The recess etch is selective to the material employed in the protective gate liner and, as a result, does not remove the protective gate liner or underlying portions of the gate electrode layer.

The method 300 then continues at block 324, wherein strain inducing recess structures are formed within the recessed regions. The strain inducing recess structures induce a type of strain that improves mobility of channel regions defined within the semiconductor body. For example, the recess structures can be comprised of a compressive strain producing material, such as silicon-germanium. As another example, the recess structures can be comprised of a tensile strain producing material, such as silicon-carbon. An example of a suitable silicon-carbon formation process is a selective epitaxial deposition process such as an LPCVD (low pressure chemical vapor deposition) process. By using a carbon-containing gas source (e.g., C2H4) as an additional source gas, the silicon material formed in the recesses is doped with carbon in-situ. The silicon-carbon within the recessed regions form an alloy that has a lattice with the same structure as the silicon body lattice, however, the silicon-carbon alloy has a smaller spacing. Consequently, the silicon-carbon within the recesses will tend to contract, thereby creating a tensile stress within the channel regions of the semiconductor body.

The gate structures are protected during formation of the recess structures due to the protective gate liner, which prevents or mitigates formation of the recess structures and/or associated materials during the formation process. As a result, the gate electrode layer remains substantially uniform.

Source/drain regions are then formed in the well regions at block 326. The source/drain regions are formed by implanting n-type dopants (e.g., arsenic and/or phosphorous) or p-type dopant(s) (e.g., boron) at block 326. The source/drain dopant is introduced into the exposed areas (top of gate electrode and active areas not covered by the sidewall spacers). Alternately, source/drain dopants can be implanted during the formation of the filled recess structures. Subsequently, a thermal process can then be performed to activate implanted dopants within the source/drain regions.

Subsequently, silicide processing is performed at block 328, wherein a refractory metal material is formed over the device, followed by a thermal process, wherein the metal and silicon interfaces react to form a silicide (on top of the gate and in the source/drain regions). Unreacted metal is then stripped away, and back end processing such as interlayer dielectric and metallization layers are formed at block 330 to conclude the device formation at block 332.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating a CMOS semiconductor device comprising:

providing a semiconductor body;

performing well formation and isolation processing in the semiconductor body and defining a first region and a second region;

forming a gate dielectric layer on the semiconductor body;

forming a gate electrode layer on the gate dielectric layer;

forming a protective gate liner on the gate electrode layer;

forming a resist mask that defines gate structures;

patterning the gate electrode layer to form the gate structures;

removing the resist mask wherein the protective gate liner remains on the gate electrode layer of the gate structures;

forming a protective region layer over the second region including the remaining protective gate liner of the semiconductor body within the second region;

performing a recess etch of active regions within the first region, except on the liner protected gate electrode layer, to form recessed regions within the first region adjacent the liner protected gate electrode layer;

forming recess structures within the recessed regions of the first region by forming strain inducing material within the recessed regions subsequent to forming the protective region layer of the second region, the protective gate liner maintaining uniformity of the gate electrode in the first region and the protective region layer maintaining integrity of an entirety of the second region during forming strain inducing material within the recessed regions;

removing the protective region layer from the second region;

removing the protective gate liner from the first and second regions; and forming source/drain regions within the first and second regions subsequent to removing the protective region layer and the protective gate liner.

2. The method of claim 1, further comprising forming a second protective region layer over the semiconductor body within the first region after removing the protective region layer from the second region.

3. The method of claim 1, wherein the protective gate liner comprises silicon nitride.

4. The method of claim 3, wherein the protective region layer comprises silicon dioxide.

5. The method of claim 1, wherein the protective gate liner comprises oxide and the protective region layer comprises silicon nitride.

6. The method of claim 1, further comprising forming offset spacers on lateral edges of the gate structures prior to forming the protective region layer.

7. The method of claim 6, further comprising forming extension regions in the semiconductor body in the first and second regions and forming sidewall spacers adjacent the offset spacers in the NMOS and PMOS regions prior to forming the protective region layer.

8. The method of claim 1, wherein the protective gate liner mitigates degradation of the gate electrode layer during formation of strain inducing recess structures.

9. The method of claim 1, wherein the protective region layer maintains integrity of the NMOS region during formation of strain inducing recess structures.

* * * * *